United States Patent
Dhuna

(10) Patent No.: US 7,010,285 B2
(45) Date of Patent: Mar. 7, 2006

(54) PHASE LOCKING LOOP FREQUENCY SYNTHESIZER

(75) Inventor: Ashok Dhuna, Finchampstead (GB)

(73) Assignee: Synad Technologies Limited, Reading (GB)

( * ) Notice: Subject to any disclaimer, the term of this patent is extended or adjusted under 35 U.S.C. 154(b) by 417 days.

(21) Appl. No.: 10/412,369

(22) Filed: Apr. 10, 2003

(65) Prior Publication Data

US 2003/0216130 A1 Nov. 20, 2003

(30) Foreign Application Priority Data

May 14, 2002 (GB) .................................... 0211048

(51) Int. Cl.
*H04B 1/06* (2006.01)
(52) U.S. Cl. ...................... 455/260; 455/264; 375/376; 331/1 R
(58) Field of Classification Search ................... 455/76, 455/118, 255–260, 263–265; 375/373, 376; 331/1 R, 175, 34
See application file for complete search history.

(56) References Cited

U.S. PATENT DOCUMENTS

| 3,895,311 | A | | 7/1975 | Basse et al. | |
| 4,942,371 | A | * | 7/1990 | Kashiwaba et al. | ........... 331/14 |
| 5,166,641 | A | * | 11/1992 | Davis et al. | ................ 331/1 A |
| 5,335,365 | A | | 8/1994 | Ballantyne et al. | |
| 6,717,484 | B1 | * | 4/2004 | Ben-Ayun et al. | .......... 331/175 |

FOREIGN PATENT DOCUMENTS

| JP | 6200 92521 A | 4/1987 |
| JP | 0700 30418 A | 1/1995 |

* cited by examiner

*Primary Examiner*—Nguyen T. Vo
(74) *Attorney, Agent, or Firm*—Blakely, Sokoloff, Taylor & Zafman; Stephen M. De Klerk

(57) ABSTRACT

A frequency synthesiser 50 comprises a VCO 56 whose output signal frequency is proportional to input voltage amplitude. In a first mode, the VCO output is fed via a divider 24 to a phase detector 26 which also receives a reference signal. The phase detector output passes via a loop filter 28 and a controller 70, which is passive in the first mode, back to the VCO 56 to form a closed phase-locked loop. To adjust the frequency synthesiser output frequency, the controller 70 switches the circuit into a second mode in which the VCO 56 output is not fed back, and a constant voltage source is supplied to the VCO 56 instead so that the VCO output frequency is constant. The VCO transfer function is then altered by adjusting a variable capacitor 60 therein, and the circuit is then switched back to the first mode. The locking time of the synthesiser is thereby improved as output frequency changes.

19 Claims, 11 Drawing Sheets

MODE 1

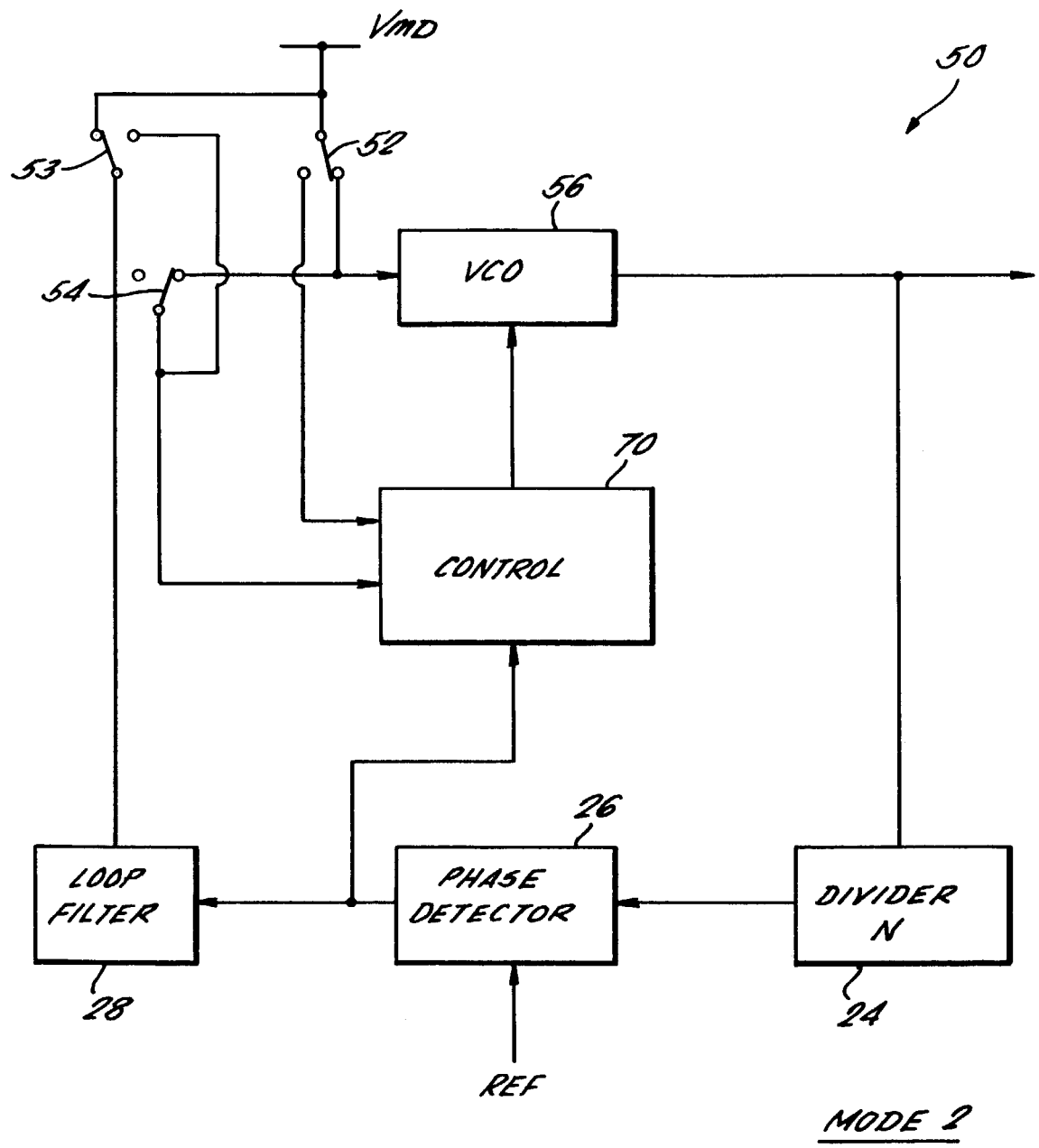

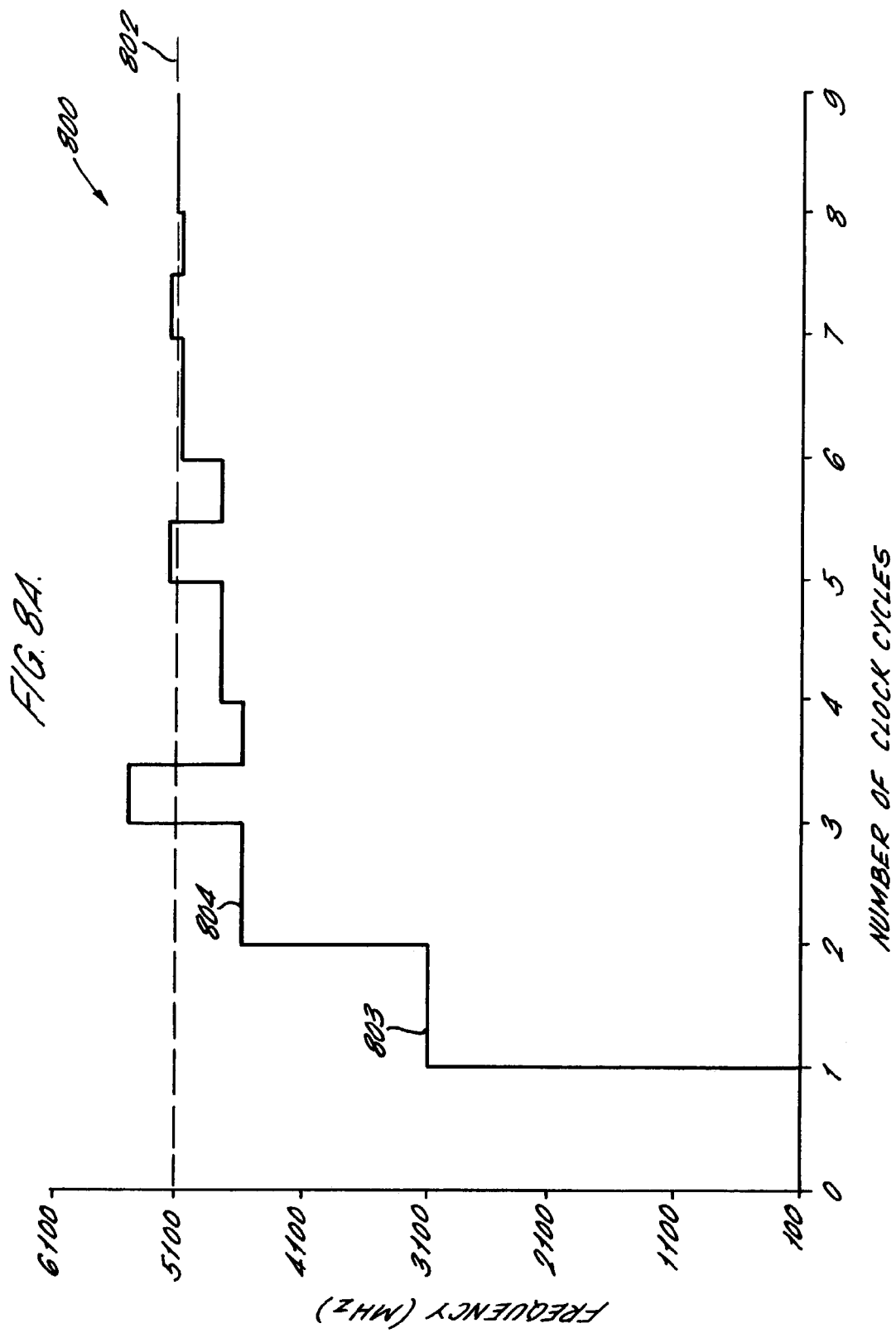

PHASE LOCKING LOOP FREQUENCY SYNTHESIZER

CROSS-REFERENCE TO OTHER APPLICATIONS

This Application claims priority from Great Britain Patent Application No. 0211048.4, filed on May 14, 2002.

FIELD OF THE INVENTION

The present invention relates to the field of phase locking loop frequency synthesisers, particularly but not exclusively for use in Wireless Local Area Networks.

BACKGROUND TO THE INVENTION

Phase locking loops (PLLs) are well known circuits with a number of applications. A primary application of PLLs is in frequency synthesis, where a high frequency signal is generated from a much lower reference frequency. The frequency of the generated signal is determined by the value of a multiplier. For example, an input reference frequency of 1 MHz can be multiplied by 2000 to produce a 2000 MHz output signal. The value of the multiplier can be easily changed thus allowing the frequency of the output signal from the frequency synthesiser to be changed easily. This means that the frequency of the output signal can be changed quickly.

However, such frequency synthesisers suffer from drawbacks, particularly where it is necessary or desirable to change the output frequency thereof quickly. This problem can be better understood by considering the example of FIG. 1, which shows a block diagram of a known part of a demodulator 2 such as superheterodyne receiver. The demodulator 2 includes an antenna 4, arranged to receive radio frequency signals which are bandpass filtered by a BPF 6, amplified by a low noise amplifier 8 and then mixed at mixer 12 with a variable frequency from a frequency synthesiser 10 such that the mixer output is a fixed intermediate frequency (IF). In order to maintain the fixed IF as the frequency of the received RF signals changes, the frequency synthesiser 10 must change its output accordingly. For a PLL frequency synthesiser, this in turn requires a change in the frequency multiplier.

The frequency change is typically carried out via the PLL, and a schematic PLL is shown in FIG. 2. This well-known arrangement includes a voltage controlled oscillator 22, a divider 24, a phase detector 26 fed with a reference (clock) signal, and a loop filter 28.

The VCO 22 produces the output signal of the frequency synthesiser 10. This output is fed back also to the divider 24 whose output is a signal in phase with the VCO output signal but at a frequency which is (1/N) of the VCO output frequency. Both the reference signal and divided VCO output are input to a phase detector 26 which generates an output related to the phase difference (if any) between the VCO output signal and an input reference signal (REF). The phase error signal is filtered by the loop filter 28 and fed to the VCO input which causes adjustment of the output thereof in dependence upon the phase difference input. Thus, the output of the VCO 22 locks onto N times the reference frequency, REF.

The open loop s-domain transfer function of the frequency synthesiser 10 shown in FIG. 2 is $$\frac{K_{VCO} K_{PD} LF(s)}{N} \qquad (1)$$

where $K_{VCO}$ is the gain of the VCO 22;
$K_{PD}$ is the gain of the phase detector 26;
LF(s) is the s-domain transfer function of the loop filter including the VCO 22 and the phase detector 26; and
N is the multiplier.

As can been seen from equation (1), as the value of the multiplier N changes, the open loop s-domain transfer function of the frequency synthesiser changes. FIG. 3a shows a schematic plot (in the upper part) of DC gain of the loop transfer function vs. frequency. The lower part shows the phase margin as a function of frequency. As is seen in FIG. 3a, the gain vs. frequency function changes from the solid line 34 where $N=N_1$ to the dotted line 32 where $N=N_2$, $N_2$ being less than $N_1$.

The frequency at which the DC gain passes through zero is the frequency at which the phase margin is measured for a given N. So, for $N_1$ (given by the solid line 34 in FIG. 3a), the phase margin is at a maximum given by $\emptyset_1$. As $N_1$ changes to $N_2$, to produce the gain vs. frequency plot 32 (dotted line), the phase margin decreases to $\emptyset_2$. The phase margin is a measure of the speed at which the frequency synthesiser 10 settles to an output frequency and is determined by the characteristics of the loop filter 28. The net result of this is that the phase margin has a maximum for a particular value of N (in this example, $N_1$,) and decreases for $N=N_1$. A PLL can be designed to have a minimum settling time i.e. phase margin for a most convenient value of N but this necessarily means a degradation in time to lock as different values of N are required, i.e. different output frequencies.

FIG. 3b shows a graph 40 of frequency response against time for the known frequency synthesiser 10. The step response 42 shows an ideal frequency characteristic, where, as the value of N changes from $N_1$ to $N_2$, the output frequency of the frequency synthesiser instantly changes from $f_1$ to $f_2$. However, due to the deterioration in phase margin as $N_1$ changes to $N_2$ (FIG. 3a), the actual response of the frequency synthesiser 10 would be similar to the underdamped response 44 or the overdamped response 46.

The lower the phase margin, the longer the time taken for the frequency response to settle to a desired frequency 42 output.

Such a settling period can present serious difficulties when fast settling is necessary, for example in wireless local area networks (WLANs).

It is therefore an object of the present invention to address this problem.

SUMMARY OF THE INVENTION

According to one aspect of the present invention there is provided a frequency synthesiser for generating a plurality of phase locked output frequencies comprising: a signal generator arranged to generate an output signal having an output phase and whose frequency is dependent upon an input signal and a first transfer function of the signal generator; a comparator for comparing the output signal phase with the phase of a first desired signal, whose frequency is a first multiple value of the reference frequency of a reference signal, and for generating a feedback signal which is input, in a first mode, to the signal generator as the said input signal, so as to cause the phase of the output signal of the signal generator to be locked to the phase of the first desired signal; a first switch for switching between the first mode in which the said feedback signal is supplied as the input signal of the signal generator, and a second mode, in response-to said first multiple value changing to a second multiple value, thereby producing a second desired frequency, whereby in said second mode, a fixed control signal is supplied as the said input signal of the signal generator; a controller for adjusting the transfer function of the signal generator, from a first transfer function value to a second transfer function value, in the said second mode so as to cause the output frequency thereof to be altered; and a second switch for switching from the second mode to the first mode, wherein said switching is actuated when the frequency difference between the signal generator output, as determined by said second transfer function value, and the second desired frequency is below a threshold value, whereby in said first mode, the feedback signal is now generated by said signal generator with said second transfer function.

This is advantageous over the prior art because by altering the transfer function of the oscillator, the time taken for the frequency synthesiser to settle at the desired frequency is reduced. Accordingly, the present invention can be used in applications where the time taken to settle at a particular output frequency is crucial, such as in Wireless Local Area Networks. In a Wireless Local Area Network a user terminal communicates with a number of access points so that a remote user can access a wired infrastructure.

In a second aspect of the present invention there is provided a method of generating a plurality of phase locked output frequencies comprising: generating an output signal having an output phase and whose phase is dependent upon an input signal and a first transfer function of a signal generator; comparing the output signal phase with the phase of a first desired signal, whose frequency is a first multiple of a reference signal, generating a feedback signal which is input, in a first mode, to the signal generator as the input signal, so as to cause the phase of the output signal of the signal generator to be locked in the phase of the first desired signal; switching between the first mode in which the feedback signal is supplied as the input signal of the signal generator, and a second mode, the switching being in response to the first value of the first multiple changing to a second value, thereby producing a second desired frequency, whereby in said second mode, a fixed control signal is supplied as the said input signal of the signal generator; adjusting the transfer function of the signal generator, from a first transfer function value to a second transfer function value, in the second mode so as to cause the output frequency thereof to be altered; and switching from the second mode to the first mode, wherein said switching is actuated when the frequency different between the signal generator output, as determined by the second transfer function value, and the second desired frequency is below a threshold value, whereby in said first mode, the feedback signal is now generated by said signal generator with said second transfer function.

BRIEF DESCRIPTION OF DRAWINGS

An embodiment of the present invention will now be described, by way of example only, with reference to the following Figures in which:

FIGS. 4a and 4b show a block diagram of the frequency synthesiser according to one embodiment of the present invention, in first and second modes respectively;

FIGS. 8a and 8b shows typical graphs of frequency output versus the number of clock cycles for the frequency synthesiser of FIGS. 4a and 4b.

DETAILED DESCRIPTION OF A PREFERRED EMBODIMENT

A frequency synthesiser 50 according to an embodiment of the present invention will now be described with reference to FIGS. 4a and 4b.

A voltage controlled oscillator (VCO) 56 generates an output signal whose frequency is proportional to the amplitude of an input voltage. The output of the VCO 56 is fed to a circuit output for input, for example, to a mixer. The VCO output is also fed to a divider 24. The output of the divider 24 is fed into a phase detector 26 which also receives a reference signal input. The output from the phase detector 26 is fed into a loop filter 28. The function of the divider 24, the phase detector 26, and the loop filter 28 are as described previously in connection with the prior art and so will not be described in any further detail.

Figure 1:
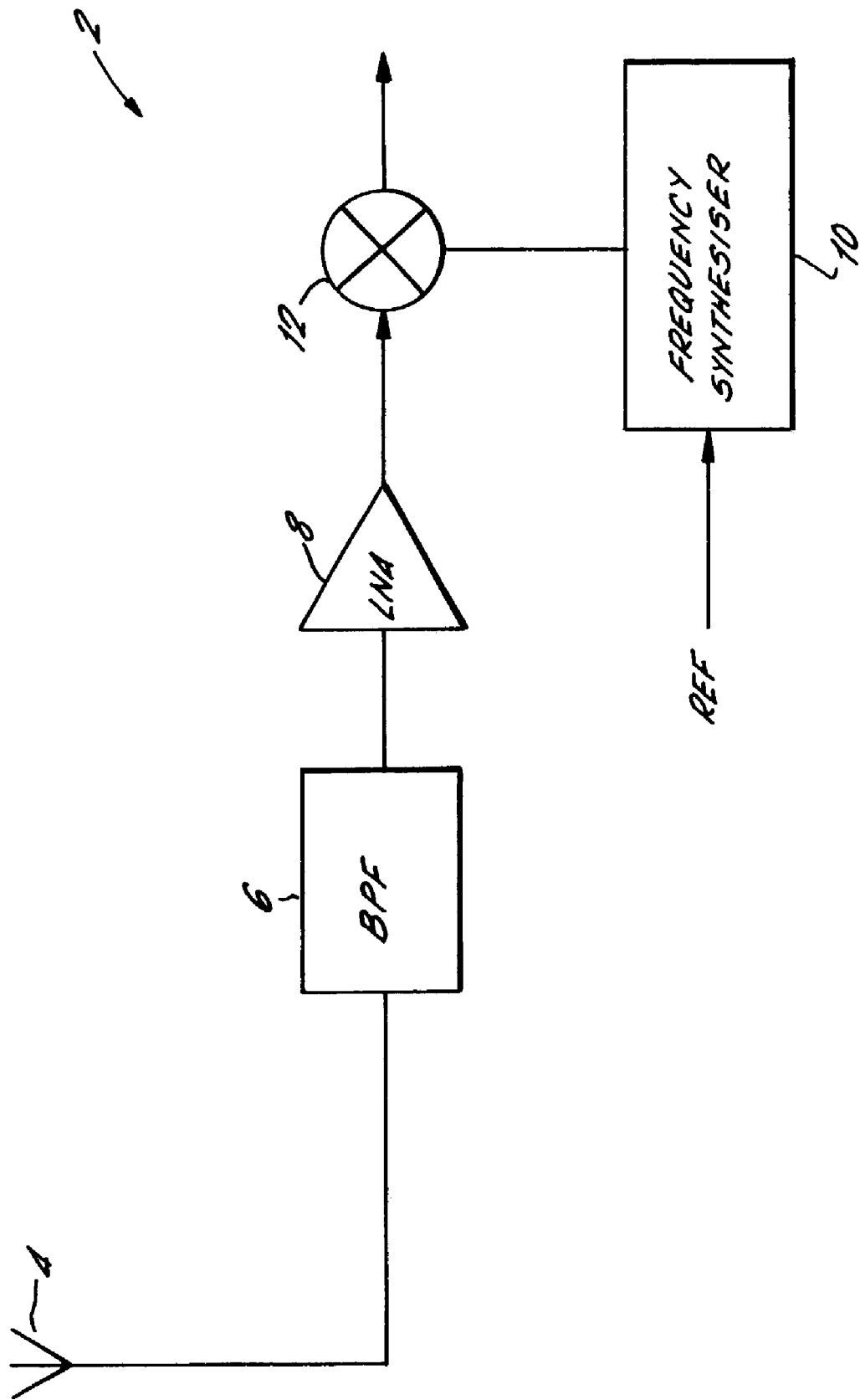
FIG. 1 shows a block diagram of a part of a known demodulator.
Figure 2:
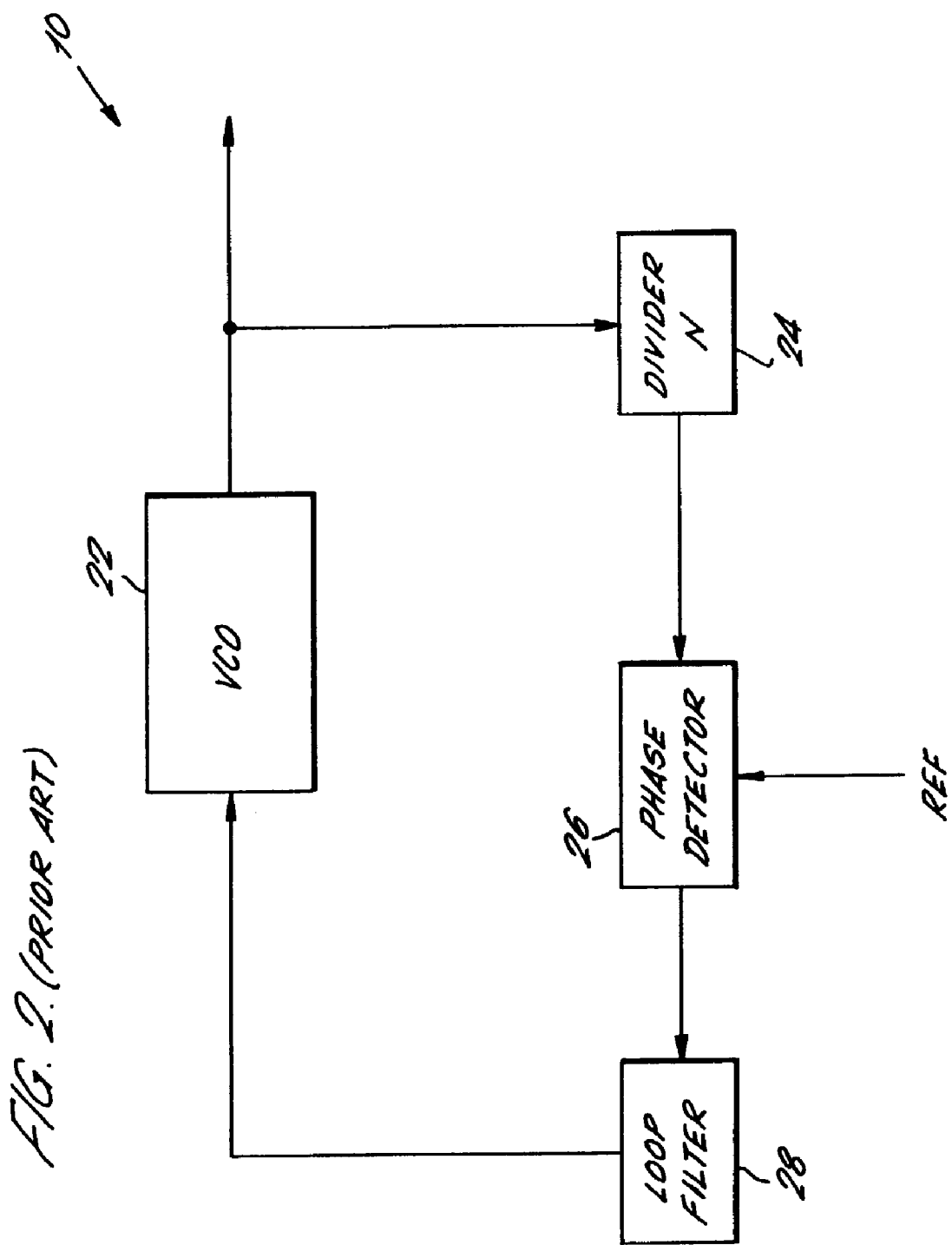
FIG. 2 shows a block diagram of a known phase lock loop frequency synthesiser.
Figure 3A:
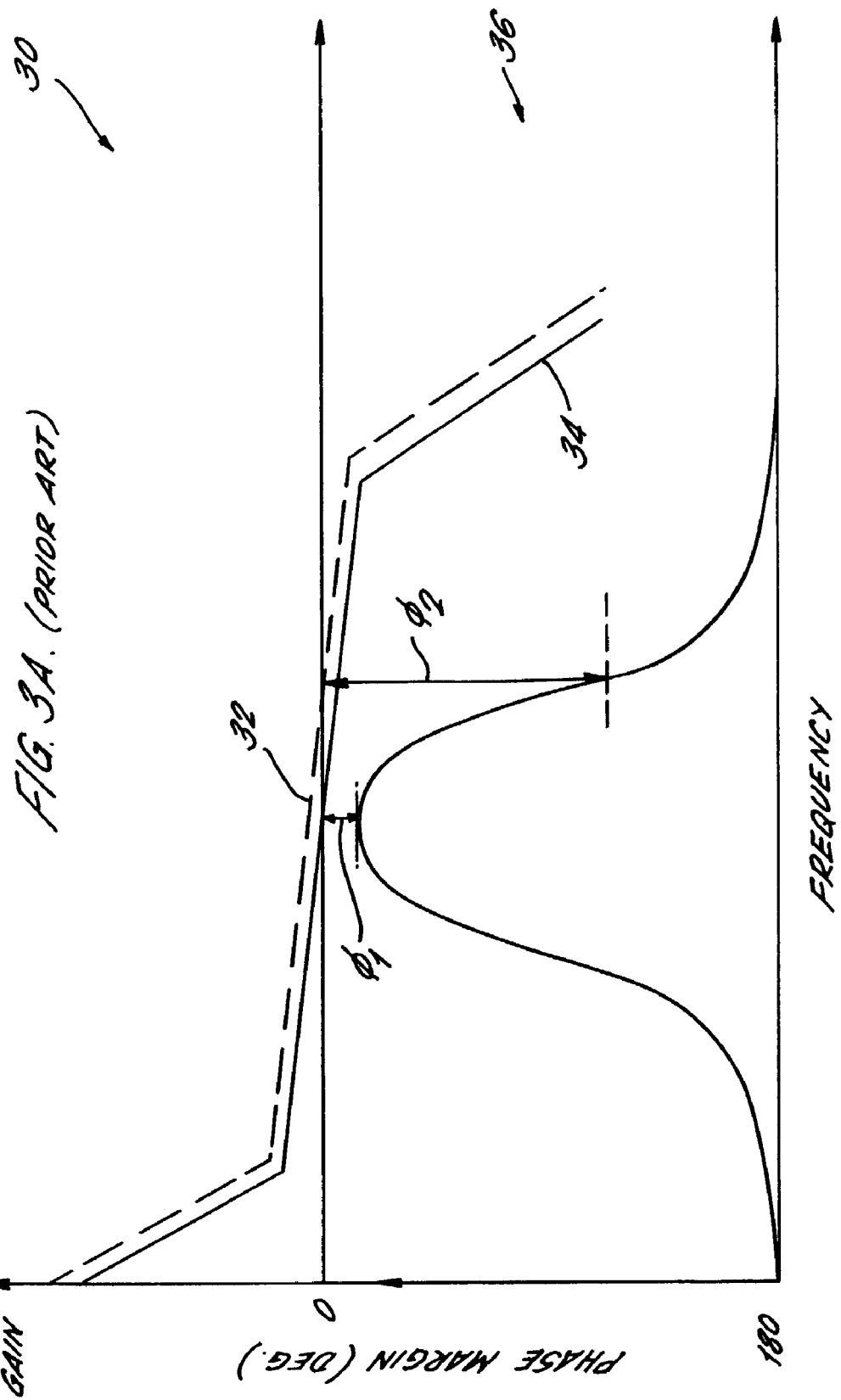
FIG. 3a shows a graph of gain and phase margin against frequency for the frequency synthesiser of FIG. 2.
Figure 3B:
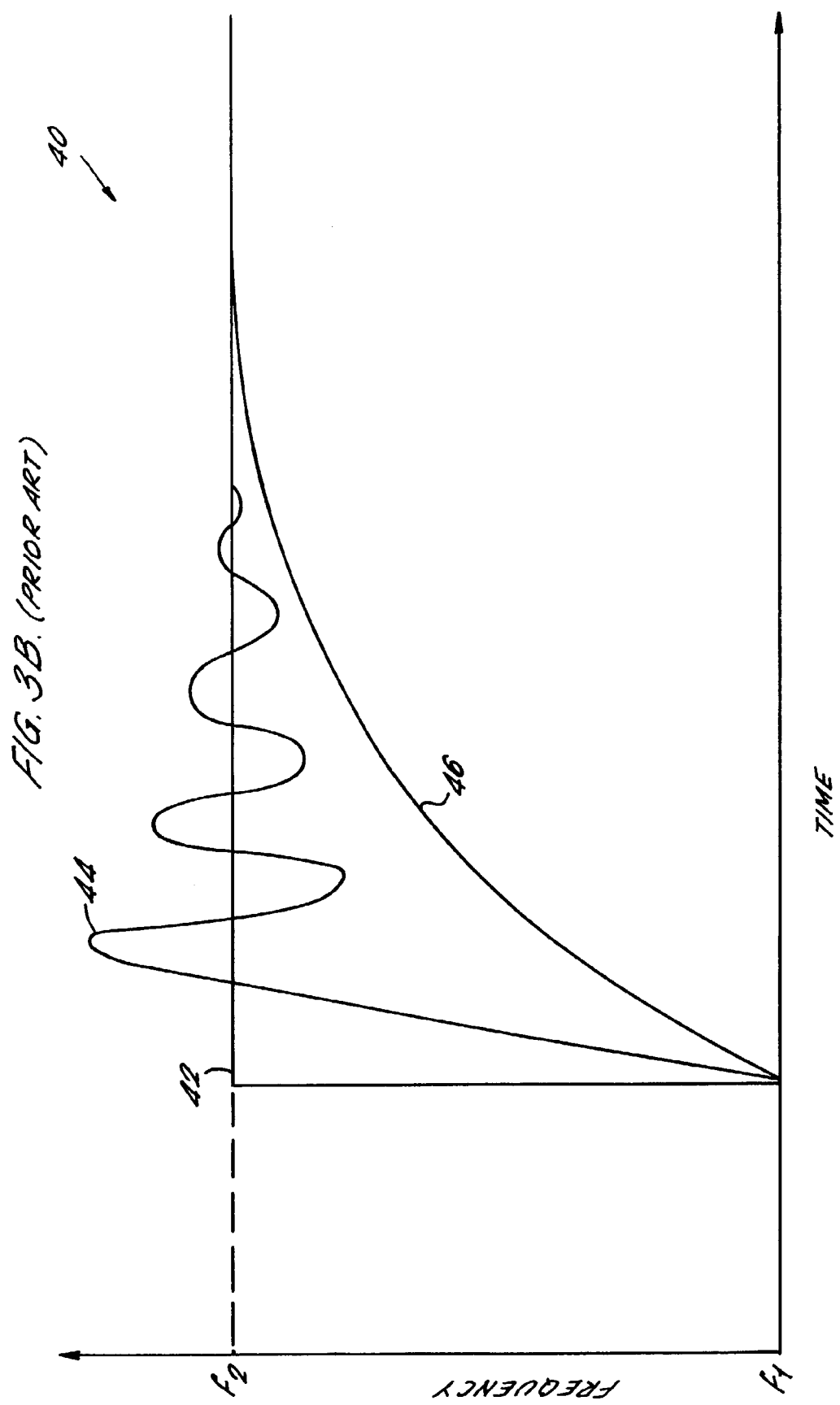
FIG. 3b shows a graph of frequency response against time for the frequency synthesiser of FIG. 2.
Figure 4A:
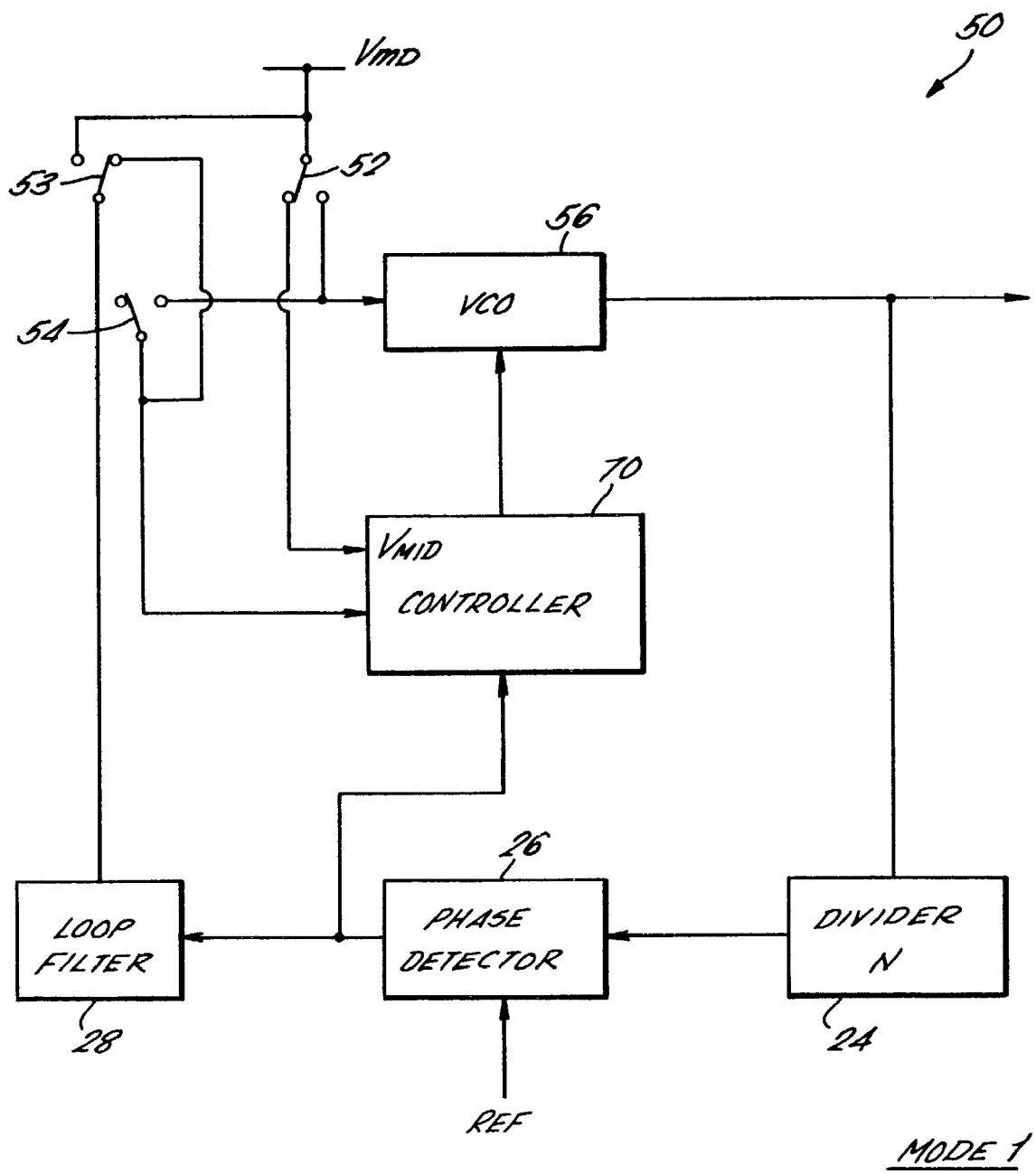

In a first mode, shown in FIG. 4a, the loop filter 28 generates an output which is fed via a first switch 54 and a third switch 53, which is closed, to a controller 70. In this first mode the controller is essentially passive in that it passes the output of the loop filter 28 back to the VCO 56 without further processing. Thus, the loop is closed and the PLL formed by the VCO 56, divider 24, phase detector 26, and loop filter 28 operates in accordance with prior art techniques. In a second mode, however, shown in FIG. 4b, the first switch 54 is open so that there is no negative feedback of the VCO output. Instead, the VCO input is provided from a constant voltage source $V_{MID}$ which is supplied via a now closed second switch 52.

The circuit is switched between the first and second modes by the central controller 70. This receives an input from the phase detector in both modes, and controls both of the switches 54, 52.

The function of the frequency synthesiser 50 will now be described by way of an example in which the value, N, of the divider is changed. When the frequency synthesiser is generating an output at a first frequency $f_1$, the circuit operates in the first mode described above in connection with FIG. 4a. When the frequency output is to be changed, however, to a second frequency $f_2$ (for example to maintain an IF output of a mixer at a constant frequency when the frequency of a received RF signal changes), the controller 70 opens the second switch 54 so that the feedback loop between the loop filter 28 and the VCO 56 is broken and the circuit switches to the second mode of FIG. 4b. In this mode, the output of the loop filter 28 is connected to $V_{MID}$, through the third switch 53. As noted previously, because the frequency of the signal output by the VCO 56 is proportional to the voltage of the input signal, the frequency of the signal output by the VCO 56 is constant in this second mode.

As the frequency output by the VCO 56 (in this example, immediately upon switching modes, equal to $f_1$) is proportional to the voltage at the input, the frequency of the signal output by the VCO 56 is equal to the product of the voltage $V_{MID}$ and a constant of proportionality. Therefore, $$f_1 = K_{vco} \cdot V_{mid}.$$

where $f_1$ is the frequency of the signal output by the VCO 56 when the circuit switches into the second mode; and $K_{VCO}$ is the constant of proportionality equal to the voltage gain of the VCO 56. Additionally, assuming that, upon switching from the first to the second mode, the PLL of FIG. 4a had settled or locked to the reference signal phase, the output frequency $f_1$ will be equal to the product of the reference frequency and a first multiplying factor $N_1$, that is to say, $$f_1 = f_{ref} \cdot N_1.$$

Therefore, $$\frac{K_{vco}}{N_1} = \frac{f_{ref}}{V_{mid}} \quad (2)$$

Both $f_{ref}$ and $V_{mid}$ are constant regardless of the output frequency of the circuit 50 of FIGS. 4a and 4b. The output frequency of the VCO 56 is now to be changed to $f_2$, however. This requires that the denominator N of the divider in turn be changed from $N_1$ to $N_2$. To maintain a constant ratio $$\frac{f_{ref}}{V_{mid}},$$

therefore, $K_{vco}$ needs to change in order that the ratio of $K_{vco}$ to N likewise remains constant whether $N=N_1$ or $N=N_2$.

Figure 5:
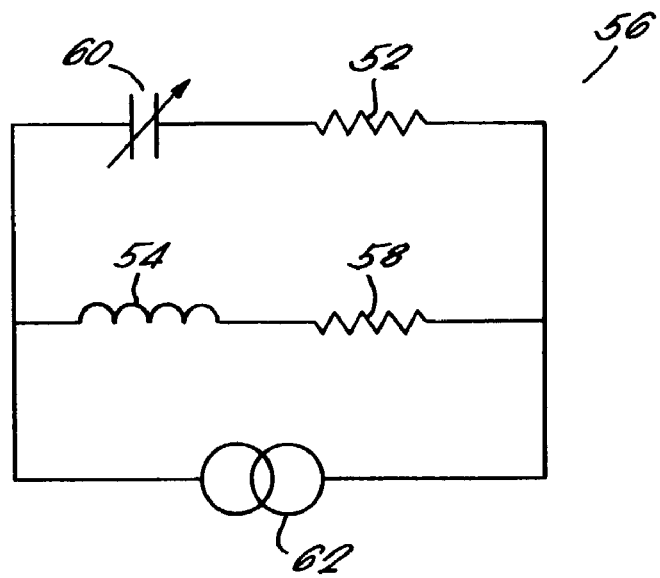
FIG. 5 shows a resonant circuit used in the frequency synthesiser of FIGS. 4a and 4b.

FIG. 5 shows in more detail an embodiment of a suitable VCO 56. The VCO 56 consists of a parallel network of a variable capacitor 60, an inductor 54 and an active element 62. The active element 62 compensates for the resistive losses associated with the capacitor 60 and the inductor 54. The resistive losses are represented by a first resistor 52 and a second resistor 58 respectively. The variable capacitor 60, in this case, determines the resonant frequency of the parallel network. The resonant frequency $V_{out}$ is given by $$f_{out} = \frac{1}{2\pi\sqrt{LC}} \quad (3)$$

where L is the inductance of the inductor 54 and C is the capacitance of variable capacitor 60. As is understood, the inductor 54 could be varied instead of, or as well as, the capacitor 60 to vary the resonant frequency of the VCO 56. It should also be noted that the gain of the VCO 56 changes with the value of the capacitor 60.

Figure 6:
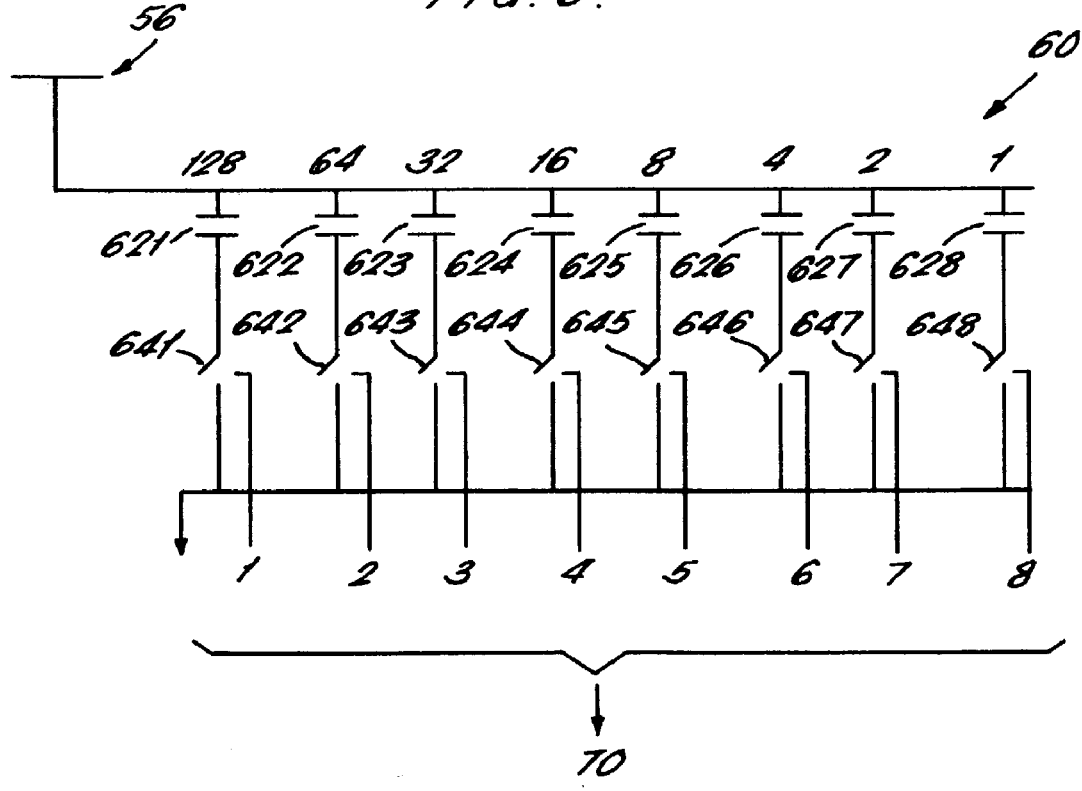
FIG. 6 shows a capacitor array used in the resonant circuit of FIG. 5.

FIG. 6 shows the variable capacitor 60 as used in the VCO 56 of FIG. 5. The variable capacitor 60 comprises an array of capacitors 621–628. Each of the capacitors in the array have different values. In this case, the capacitor with the lowest value 628 has a typical value of $1_pF$, although the capacitor with the lowest value 628 depends on the required resolution, as is appreciated. Each subsequent higher value capacitor in the array has a value that is a multiple of the lowest value capacitor 628. In the present example, the multiple in this case is $2^n$, where n is the number of the capacitor in the array. In other words, as there are eight capacitors in the capacitor array, the largest capacitor 621, being the eighth capacitor, will have a capacitance that is $2^8$ times larger than that of the lowest value capacitor 628. Other arrangements and multiples within the array are possible.

The array of capacitors 621–628 are connected between the resonant circuit 56 660 and an array of switches 641–648. The array of switches are connected to ground. Each switch in the array of switches 641–648 is controlled by the controller 70 and is arranged to switch each capacitor 621–628 between ground and open circuit. This means that the controller 70 can control the capacitance of the VCO 56 by opening and closing each of the switches in the switch array 641–648. As the capacitance of the resonant circuit 56 can be varied, the resonant frequency and therefore the gain of the VCO 56 can be varied by the control circuit.

As mentioned previously with reference to equation (2), $$\frac{K_{vco}}{N}$$

should be a constant for any value of N. Therefore, as N is changed from $N_1$ to $N_2$, the controller 70 alters the value of $K_{vco}$ in consequence. This is achieved by varying the value of the capacitor 60 in the VCO 56.

When the first switch 52 is closed and the VCO 56 is connected to a fixed voltage $V_{MID}$, to change the circuit of FIG. 4a (first mode) to the circuit of FIG. 4b (second mode), the controller 70 simultaneously closes all the switches 641–648 and the denominator $N_1$ in the divider is changed instantaneously to $N_2$. The value of the capacitor 60 is then at a maximum and, accordingly, the resonant frequency of the VCO 56 is at a minimum. The controller 70 then opens switch 641 which is associated with the largest capacitor 621, increasing the resonant frequency of the VCO 56. The phase detector 26 acts as a frequency comparator in the second mode (FIG. 4b) and compares the frequency of the signal output from the VCO 56 (divided now by $N_2$) with the frequency of the reference signal. If the divided output frequency is below the reference frequency, the value of the capacitance within the VCO 56 will be reduced. The controller 70 therefore opens switch 642 associated with the capacitor with the second largest value of capacitance 622. This reduces the overall value of the capacitance and therefore increases the resonant frequency of the VCO 56. If the divided frequency is now above the reference frequency, the value of capacitance within the VCO 56 needs to be increased. The controller 70 therefore closes the switch 642 and opens switch 643 associated with the capacitor with the third largest capacitance 623. The controller 70 continues successively approximating the resonant frequency of the VCO 56 until the VCO output frequency as divided by $N_2$ is within (either above or below) the tolerance defined by the smallest capacitance value 628.

Once the required frequency is within tolerance, the controller 70 opens the first switch 52 and closes the second switch 54 so that the phase lock loop switches back into the first mode (FIG. 4a), but now with $N_2$ as a denominator in the divider 24. As the signal output by the VCO 56 is now at a frequency that closely resembles the new required frequency $f_2$, the output of the frequency synthesiser 10 (which should be near to $N_2$.REF) will lock to the reference frequency very quickly.

An example of the logic which may be employed by the controller 70 of FIGS. 4a and 4b will now be described with particular reference to FIGS. 7a and 7b.

Figure 7A:
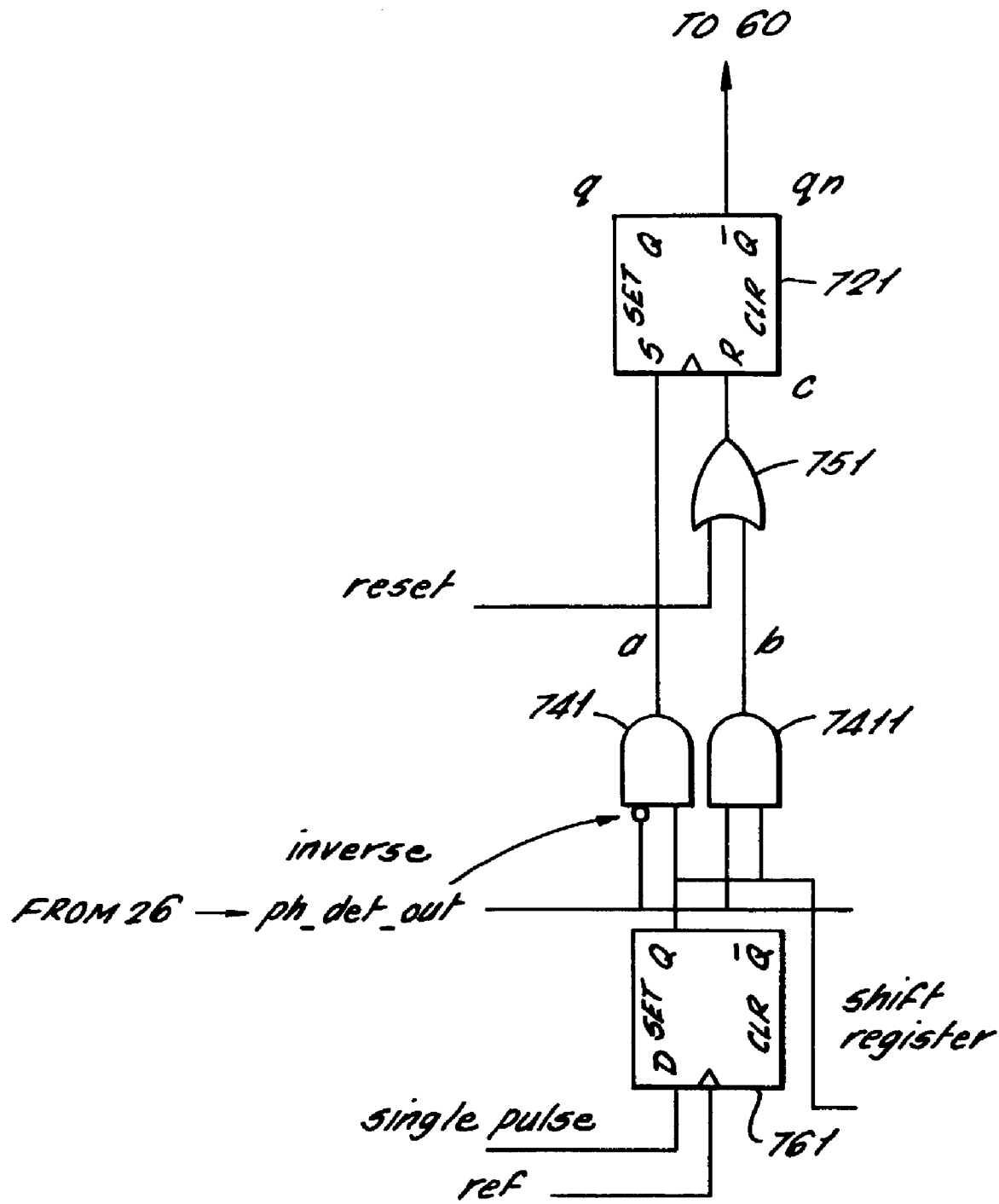
FIG. 7a shows a block diagram of a section of the control circuit used in the frequency synthesiser of FIGS. 4a and 4b.

FIG. 7a shows one section 701 of the control unit which may be used in the frequency synthesiser of FIGS. 4a and 4b. FIG. 7b shows an embodiment of the controller 70 of the present invention.

With reference to FIG. 7a, a non-inverting output of a D-type flip flop 761 is connected to a non-inverting input of first and second AND gates 741 and 7411 respectively. The non-inverting input of the second AND gate 7411 and the inverting input of the first AND gate 741 are connected to the output of the phase comparator 26. The output of the first AND gate 741 is connected to a SET-RESET (S-R) flip flop 721. The output of the second AND gate 7411 is connected to one input of an OR gate 751. The second input of the OR gate 751 is connected to a reset line. The reset line goes high when a new divide ratio is required. The output of the OR gate 751 is connected to the RESET input of the S-R flip flop 721. The inverting output of the S-R flip flop 721 is connected to one of the array of switches 641–648 within the capacitor array 60. The reference signal acts as a common clock connected to both the D-type flip flop 761 and the S-R flip flop 721. The input of the D-type flip flop 761 is connected to a pulse generator (not shown). Although the reference signal is used as a common clock, it should be noted that a clock signal with any frequency, may be used instead.

Initially, as the output is at a first frequency $f_1$, the input to the D-type flip flop 761 is low. This means that the output of the first and second AND gate 741 and 7411 is at a logic 0. As the RESET line is low, the inverting output of the S-R flip flop 721 remains at the previous value.

When it is desired to change the value of N from $N_1$ to $N_2$, however, an initial set-up routine is carried out as the circuit 50 first switches into the second mode of FIG. 4b. Firstly, the reset line goes to logic 1. This means the output of the OR gate 751 also goes to logic level 1. Before the next clock pulse (i.e. within the same clock pulse), the pulse signal generator (not shown) applies a logic 1 to the input of the D-type flip flop 761. Therefore, when the next clock pulse is generated, a logic level 1 signal appears on both the inverting output of the S-R flip flop 721 and the non-inverting output of the D-type flip flop 761.

As the inverting output of the S-R flip flop 721 is logic 1, the switch associated with the S-R flip flop 721 is closed, therefore increasing the capacitance of the VCO 56.

As the capacitance of the VCO 56 increases, the frequency of oscillation of the VCO 56 reduces. This may lead to a change in the output of the phase detector 26 (which is acting as a frequency comparator in this second mode). In this example, when the reference frequency is greater than the divided frequency, the phase comparator 26 outputs a logic 1. Conversely, if the divided frequency is greater than the reference frequency, the phase comparator outputs a logic 0.

As the non-inverting output of the D-type flip flop 761 is a logic level 1, the output from the first and second AND gate 741 and 7411 respectively will be dependent upon the output from the phase detector 26. Therefore, if the output of the phase detector 26 is a logic level 0, the SET input of the S-R flip flop 721 goes to a logic level 1, whereas, if the output of the phase detector 26 is at a logic level 1, the RESET input of the S-R flip flop 721 goes to a logic level 1. In other words, when the non-inverting output of the D-type flip flop is at a logic level 1, the value of the non-inverting output from the S-R flip flop 721, and therefore the capacitance of the VCO 56, depends upon the logic level of the output of the phase detector 26.

Figure 7B:
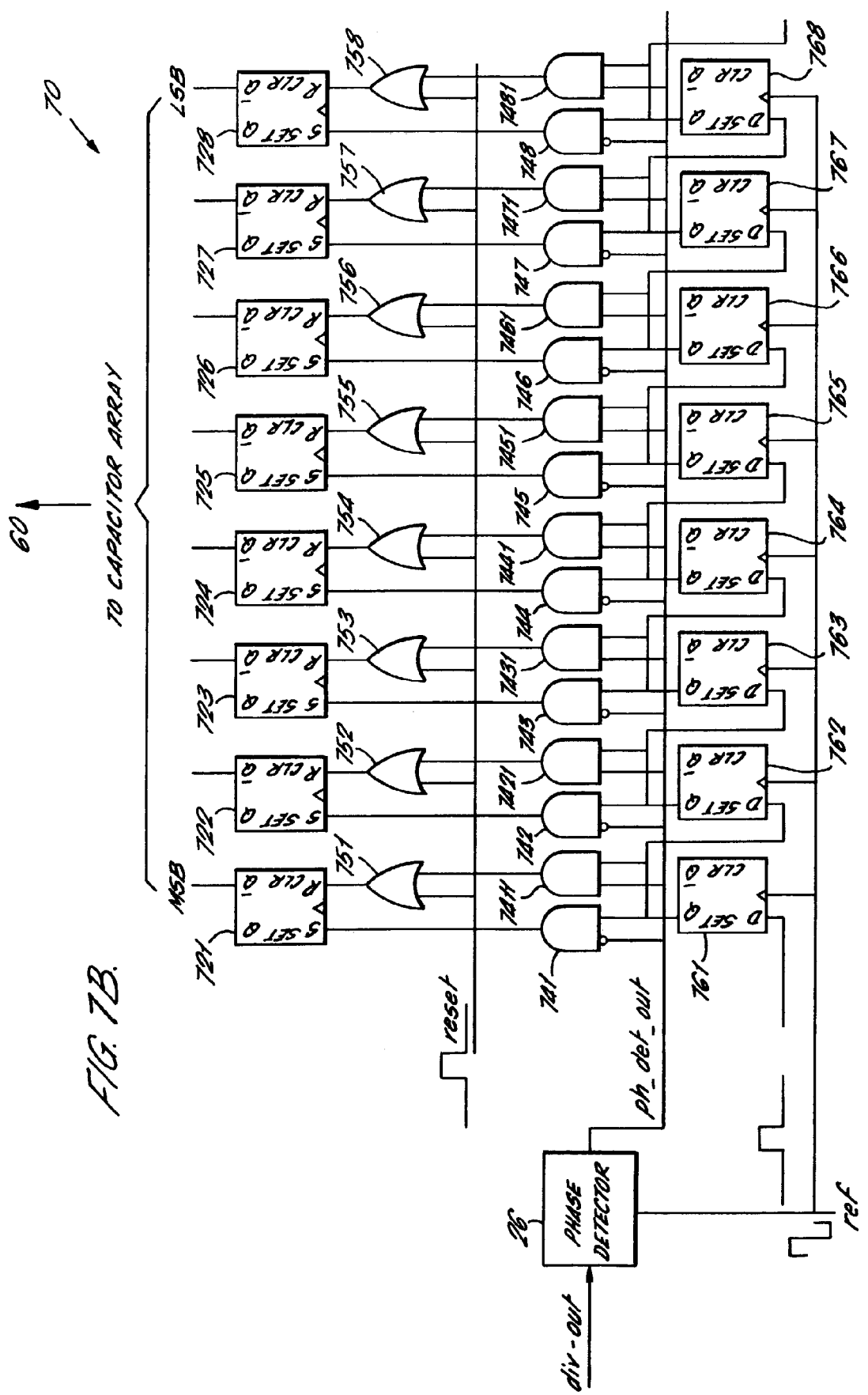
FIG. 7b shows a block diagram of the control circuit used in the frequency synthesiser of FIGS. 4a and 4b.

FIG. 7b shows an embodiment of the controller 70 of the present invention. As can be seen, the controller 70 comprises, in this case, eight sections 701 as previously described. Each inverting output from the array of S-R flip flops 721–728 is connected to a corresponding switch in the capacitor array 60. Also, the array of D-type flip flops 761–768 are connected to a common clock, which is, in this case, the reference signal. Once the initial set-up routine has been carried out, all the inverting outputs from the S-R flip flops 721–728 are at logic level 1 and so all the corresponding switches in the capacitor array 60 are closed. This ensures that the corresponding resonant frequency of the VCO 56 is at a minimum.

The output of the first D-type flip flop 761 is connected to the input of the next D-type flip flop 762. The D-type flip flops are arranged as a shift register so that the pulse generated at the input to the first D-type flip flop 761 propagates along each subsequent D-type flip flop 762–768 for each consecutive clock pulse. Therefore, as mentioned above, each consecutive capacitor within the capacitance array 60 will switch depending upon the output of the phase comparator 26 when the output of the corresponding D-type flip flop 761–768 is at logic level 1.

Although FIG. 7a and FIG. 7b show the controller 70 as being implemented in hardware, it is to be understood that the controller 70 may be readily implemented using software.

Once the settings for an output frequency fx=$N_x$.REF), they may be stored in a look-up table may also be included within the frequency synthesiser 10. For example, the look-up table may store the resonant frequency of the VCO 56 along with the corresponding output values of the S-R flip flop array 721–728. This means that, after the frequency synthesiser 10 has determined the output values of the S-R flip flop array 721–728, for a given resonant frequency and using successive approximation as described above. Therefore, if the resonant frequency is required subsequently, the controller 70 can arrange that the appropriate switches in the switch array 641–648 are opened or closed in a single clock pulse. This is particularly useful if the frequency synthesiser 10 is to be used in an environment where the same set of frequencies are used frequently, such as in the demodulation of Wireless Local Area Network transmissions. This means that the frequency synthesiser 10 can lock to the appropriate frequency much more quickly than in prior art frequency synthesizers.

It is also anticipated that a further variable capacitor may be placed in the VCO 56. This will allow for the compensation of manufacturing tolerances. The variable capacitor may be adjusted after production of the frequency synthesiser so that specified maximum and minimum resonant frequencies can be maintained, if required.

Additionally, it is understood that the array of capacitor may be replaced by a variable capacitor, such as a varicap, whose capacitance is dependent upon an external voltage, such as the loop filter output voltage.

FIG. 8a shows a typical graph 800, for the frequency synthesiser 50, of output frequency versus the number of clock cycles after the value of the multiplier has changed. In this case, the frequency synthesiser 50 is capable of producing output signals whose frequencies lie in a 6 GHz range. Therefore, if the lowest frequency signal that the frequency synthesiser can generate is 100 MHz, the maximum frequency is 6.1 GHz. As will be appreciated however, the frequency synthesiser can be used to generate a signal in any frequency band. In this example the desired frequency that the frequency synthesiser 50 is to produce is 5.1 GHz, as indicated by the dashed line 802.

Figure 8B:
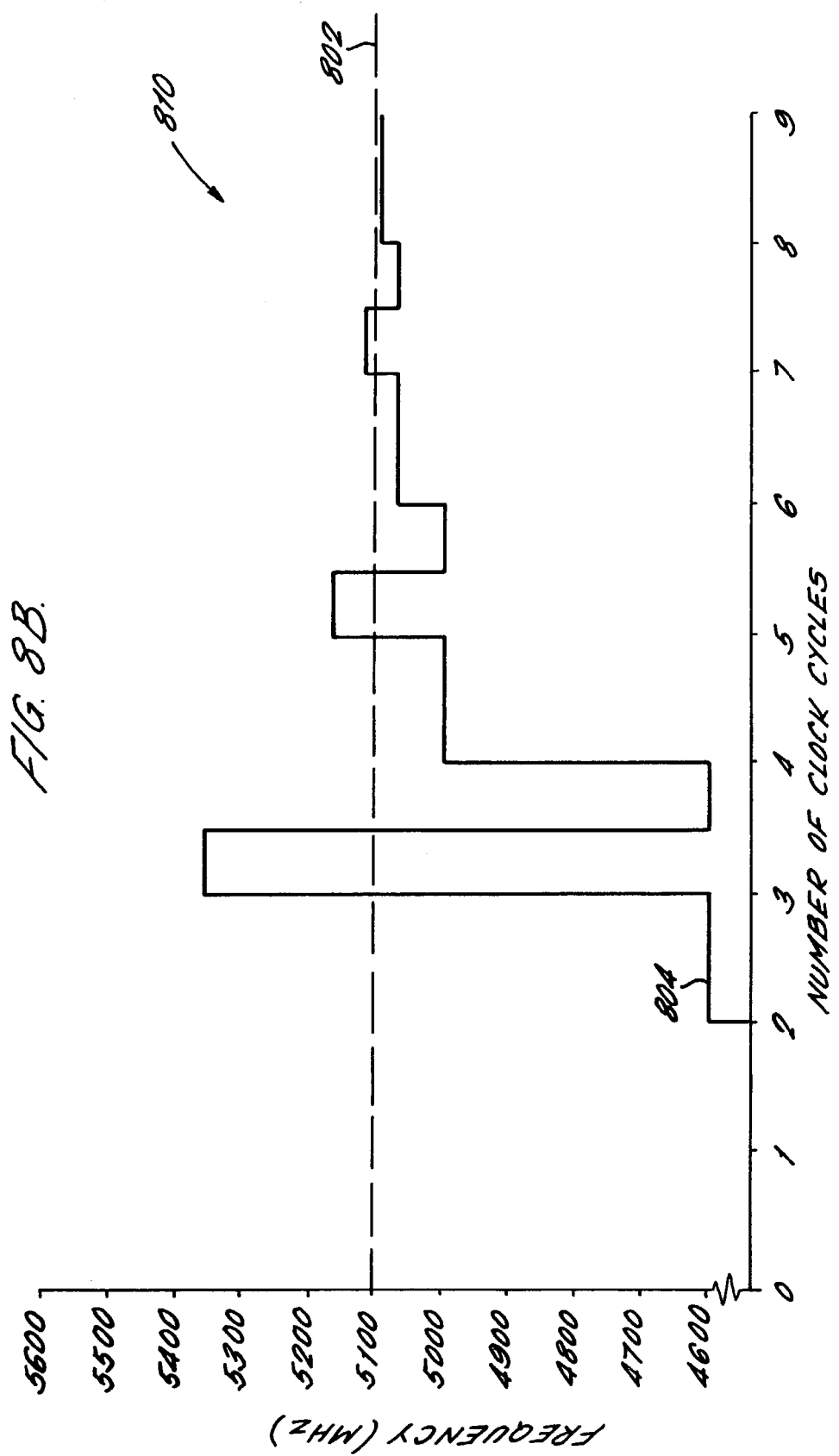

As was noted earlier, the value of each capacitor within the capacitor array 60 is twice the value of the lower value capacitor. So, for example, the third highest capacitor 623 has a capacitance that is twice the value of the fourth highest capacitor 622. This means therefore that the highest value capacitor 621 is equivalent to the sum of all the lower value capacitors 622–628. As mentioned before, once the value of the multiplier changes, the value of the capacitance within the VCO is made a maximum by closing all the switches 641–648 in the array 60. This is achieved by sending a pulse on the reset line. Therefore, the VCO output frequency is at 100 MHz. After the first reference clock pulse is received, the switch 641 associated with the highest value capacitor 621 is opened. As the sum of all the capacitors produce an output frequency within a 6 GHz band, by opening the switch associated with the highest value capacitor 621 the output frequency will increase by 3 GHz. This is shown by level 803, where the output frequency is now 3100 MHz. As described above, the switch associated with the capacitor 622 which has the second highest capacitance is now opened. Again, the capacitor with the second highest capacitance 622 has a value which is equal to the sum of all the capacitances of all the smaller capacitors. Therefore, the increase in frequency is 1.5 GHz. This is shown by level 804 in FIG. 8a and FIG. 8b, where FIG. 8b shows the graph of FIG. 8a with a smaller scale frequency axis.

After the third reference clock pulse following the reset pulse, the switch 643 associated with the capacitor 623 with the third highest capacitance is opened. This increases the frequency of the output signal by 750 MHz to 5350 MHZ. As this is above the desired frequency the switch is closed again.

The switch 644 associated with the capacitor 624 with the fourth highest capacitance is now opened. This increases the output frequency by 375 MHz so that the output signal frequency is now 4975 MHz. This process continues until the output signal is within the predefined limit of the desired frequency, which is, in this case after 8 clock cycles.

The frequency synthesiser 50 is then placed into conventional mode and locks to the desired output frequency very quickly, as mentioned earlier. It should be noted that in accordance with the present example, the frequency synthesiser can lock to the desired frequency threshold within 8 clock cycles, whereas typically for a conventional frequency synthesiser the lock time is around 40 clock cycles.

Also it should be appreciated that the above described successive approximation example may be used only to determine the switch arrangement for the desired frequency. Once the switch arrangement for the desired frequency has been determined, it may be stored and so the desired frequency threshold can be achieved in a single clock cycle. Additionally, unlike the conventional frequency synthesiser, the maximum lock time of the present invention is not dependent on the desired frequency.

Although the specific description relates to hardware logic, it is preferable to implement the invention using a high level programming language, such as VHDL, as would be appreciated.

It should also be understood that by conducting the successive approximate technique to identify the particular switch arrangement for the desired frequency in an individual frequency synthesiser, any discrepancy which may occur between different frequency synthesisers will be mitigated. In other words, due to manufacturing tolerances, the switching arrangement to achieve the same desired output frequency may be different for different frequency synthesisers. However, as each frequency synthesiser utilises a unique switching arrangement for each desired frequency, these manufacturing differences are less of a problem.

Additionally, although an array of capacitors has been described to vary the resonant frequency of the VCO 56, it is understood that an array of current sources may be used instead. This is because the rate of change of voltage is proportioned to current.

What is claimed is:

1. A frequency synthesiser for generating a plurality of phase locked output frequencies comprising:

a signal generator arranged to generate an output signal having an output phase and whose frequency is dependent upon an input signal and a first transfer function of the signal generator;

a comparator for comparing the output signal phase with the phase of a first desired signal, whose frequency is a first multiple value of the reference frequency of a reference signal, and for generating a feedback signal which is input, in a first mode, to the signal generator as the said input signal, so as to cause the phase of the output signal of the signal generator to be locked to the phase of the first desired signal;

a first switch for switching between the first mode in which the said feedback signal is supplied as the input signal of the signal generator, and a second mode, in response to said first multiple value changing to a second multiple value, thereby producing a second desired frequency, whereby in said second mode, a fixed control signal is supplied as the said input signal of the signal generator;

a controller for adjusting the transfer function of the signal generator, from a first transfer function value to a second transfer function value, in the said second mode so as to cause the output frequency thereof to be altered; and a second switch for switching from the second mode to the first mode, wherein said switching is actuated when the frequency difference between the signal generator output, as determined by said second transfer function value, and the second desired frequency is below a threshold value, whereby in said first mode, the feedback signal is now generated by said signal generator with said second transfer function.

2. A frequency synthesiser as claimed in claim 1 further comprising a memory arranged to store said second transfer function value along with its corresponding second multiple value.

3. A frequency synthesiser as claimed in claim 1, wherein said signal generator includes at least one component which determines the said transfer function, the, or the at least one component having a variable value so as to allow adjustment of the said transfer function.

4. A frequency synthesiser as claimed in claim 3, wherein the at least one component comprises an array of capacitors connectable in different configurations such that the array itself has a variable capacitance.

5. A frequency synthesiser as claimed in claim 4, wherein said array of capacitors includes a capacitor of least value which determines the said threshold value.

6. A frequency synthesiser as claimed in claim 3, wherein the at least one component comprising an array of current sources connectable in different configurations such that the array itself has a variable current.

7. A frequency synthesiser as claimed in claim 3, wherein said at least one component is a variable capacitor.

8. A frequency synthesiser as claimed in claim 1, wherein said first transfer function and second transfer function are each the gain of the signal generator.

9. A demodulator including:
   a mixer arranged to receive, at a first input, a radio frequency signal; and
   a frequency synthesiser as claimed in claim 1, said frequency synthesiser being connected to a second input of said mixer.

10. A wireless local area network transceiver including a demodulator as claimed in claim 9.

11. A wireless local area network including:
    at least one of said transceivers as claimed in claim 9; and
    at least one access point in communication with said transceiver.

12. A method of generating a plurality of phase locked output frequencies comprising:
    generating an output signal having an output phase and whose phase is dependent upon an input signal and a first transfer function of a signal generator;
    comparing the output signal phase with the phase of a first desired signal, whose frequency is a first multiple of a reference signal,
    generating a feedback signal which is input, in a first mode, to the signal generator as the input signal, so as to cause the phase of the output signal of the signal generator to be locked in the phase of the first desired signal;
    switching between the first mode in which the feedback signal is supplied as the input signal of the signal generator, and a second mode, the switching being in response to the first value of the first multiple changing to a second value, thereby producing a second desired frequency, whereby in said second mode, a fixed control signal is supplied as the said input signal of the signal generator;
    adjusting the transfer function of the signal generator, from a first transfer function value to a second transfer function value, in the second mode so as to cause the output frequency thereof to be altered; and
    switching from the second mode to the first mode, wherein said switching is actuated when the frequency different between the signal generator output, as determined by the second transfer function value, and the second desired frequency is below a threshold value, whereby in said first mode, the feedback signal is now generated by said signal generator with said second transfer function.

13. A method as claimed in claim 12, further comprising the step of storing the second transfer function value along with its corresponding second multiple value.

14. A method as claimed in claim 12 further comprising the step of:
    determining the transfer functions using at least one variable value component so as to allow adjustment of the said transfer function.

15. A method as claimed in claim 14, further including the step of connecting, in different configurations, an array of capacitors to form said at least one variable value component, such that the array itself has a variable capacitance.

16. A method as claimed in claim 15, wherein said array of capacitors includes a capacitor of least value which determines the said threshold value.

17. A method as claimed in claim 14, further including the step of connecting, in different configurations, an array of current sources to form said at least one variable value component, such that the array itself has a variable current.

18. A method as claimed in claim 14, wherein at least one said component a variable capacitor.

19. A method as claimed in claims 12, wherein said first transfer function value and second transfer function value are each the gain of the signal generator.

* * * * *